United States Patent
Ohashi et al.

(10) Patent No.: US 6,486,542 B1
(45) Date of Patent: Nov. 26, 2002

(54) SEMICONDUCTOR-SUPPORTING DEVICES, PROCESSES FOR THE PRODUCTION OF THE SAME, JOINED BODIES AND PROCESSES FOR THE PRODUCTION OF THE SAME

(75) Inventors: Tsuneaki Ohashi, Ogaki (JP); Tomoyuki Fujii, Nagoya (JP)

(73) Assignee: NGK Insulators, Ltd, Nagoya (JP)

( * ) Notice: Subject to any disclaimer, the term of this patent is extended or adjusted under 35 U.S.C. 154(b) by 0 days.

(21) Appl. No.: 09/361,743

(22) Filed: Jul. 27, 1999

(30) Foreign Application Priority Data

Jul. 28, 1998 (JP) .................................. 10-226613
Jul. 12, 1999 (JP) .................................. 11-197666

(51) Int. Cl.⁷ .............................................. H01L 23/06
(52) U.S. Cl. .................................. 257/684; 428/621
(58) Field of Search .................. 257/684, 701–702, 257/703, 704, 705, 774, 773, 729, 730, 621; 428/621, 567

(56) References Cited

U.S. PATENT DOCUMENTS

| | | | | |
|---|---|---|---|---|
| 3,609,471 A | * | 9/1971 | Scace | 317/234 |
| 4,720,434 A | * | 1/1988 | Kubo et al. | 428/567 |
| 5,633,073 A | | 5/1997 | Cheung et al. | |
| 6,020,076 A | * | 2/2000 | Fuji et al. | 428/621 |

FOREIGN PATENT DOCUMENTS

| | | | |
|---|---|---|---|
| EP | 0384479 | | 8/1990 |
| EP | 0 506 391 A | | 9/1992 |
| JP | 59137379 A | * | 1/1983 |
| JP | 9-213773 | | 8/1997 |
| KR | 90-13638 | | 9/1990 |
| WO | 91 13462 | | 9/1991 |

* cited by examiner

Primary Examiner—Fetsum Abraham
Assistant Examiner—Leonardo Andujar
(74) Attorney, Agent, or Firm—Burr & Brown

(57) ABSTRACT

A semiconductor-supporting device comprising a substrate made of an insulating material, a conductive member buried in the substrate, and a terminal connected to the conductive member and made of an electrically conductive metallic matrix-ceramic composite body.

4 Claims, 7 Drawing Sheets

SEMICONDUCTOR-SUPPORTING DEVICES, PROCESSES FOR THE PRODUCTION OF THE SAME, JOINED BODIES AND PROCESSES FOR THE PRODUCTION OF THE SAME

The present invention relates to semiconductor-supporting devices, processes for producing the same, joined bodies and processes for the production of the same.

In susceptors and the like made of ceramic materials such as aluminum nitrides, alumina, SiC or SN, materials for electrode terminals are selected from the standpoint of the heat resistance, corrosion resistance, and bondability, but there are very rare materials which completely meet the above requirements. For example, in a method of brazing a metallic terminal to a ceramic substrate, troubles such as cracking of the ceramic material due to residual stress at the time of joining or thermal stress of current-passing cycles in switching on and off the electric power are likely to occur.

For this reason, it is considered that the terminal is imparted with a plastically deforming power by using a metal having a low melting point or a high purity metal as a material of the terminal. However, since the terminal itself has a poor shape-maintaining property, a problem such as the deformation of the terminal rises, or the joining interface becomes brittle due to an excess reaction between the terminal and the brazing material, so that the joining strength sometimes drops.

On the other hand, it is known that a metal-based composite material is produced by a Lanxide process (for example, see Ceramics "CMC and MMC Net Shave Producing Technique by using Rank Side System" Vol. 32(1997) No. 2, pp 93–97). For example, it is known that wettability between molten aluminum and ceramics is improved by the rank side process in each of a silicon nitride/aluminum-based composite material and an aluminum/aluminum-based composite material. This process is generally called "non-pressure metal immersion process".

In this process, a preform having a shape near to a desired final shape is molded by using silicon carbide or alumina as a reinforcing material, and a growth-interrupting barrier film is formed at a surface of the preform other than that of the preform to which an aluminum alloy is contacted. When the resulting preform is contacted with the aluminum alloy usually at around 800° C. in nitrogen, the aluminum enters voids in the preform while wetting the ceramic material, thereby forming a composite material. In this composite material, it is confirmed that a layer of aluminum nitride is present at an interface between the ceramic material and the aluminum.

However, a technique in which such a metallic matrix-ceramic composite body is joined to a ceramic material or a metal, particularly to an insulating ceramic has not been investigated.

SUMMARY OF THE INVENTION

The present invention is directed to a semiconductor-supporting device which comprises a substrate composed of an insulating material, an electrically conductive member buried in the substrate, and a terminal connected to the electrically conductive member, and is to improve the durability at a joint portion between the insulating material and the terminal against current-passing cycles.

Further, the present invention is to provide a process for joining a metallic matrix-ceramic composite body to a ceramic material, a metal or ceramic material in which a metal is buried.

The present invention is further to provide a new process for joining plural members made of a ceramic material and a metal or a ceramic material in which a metal is buried.

The present invention relates to a semiconductor-supporting device comprising a substrate made of an insulating material, a conductive member buried in the substrate, and a terminal connected to the conductive member and made of an electrically conductive metallic matrix-ceramic composite body.

The present inventors thought that the terminal be formed of the metallic matrix-ceramic composite body having conductivity in the structure in which the terminal was joined to the substrate made of the insulating ceramic material. It was discovered that while the terminal was directly contacted with the substrate or while an intermediate material composed of an alloy containing 70 mol % or more of a main ingredient of the metallic matrix constituting the metallic matrix-ceramic composite body is interposed between the terminal and the substrate, the terminal could be joined to the insulating material by thermally treating the insulating material and the terminal or by thermally treating the insulating material, the terminal and the intermediate member at a temperature enabling a metallic matrix constituting the metallic matrix-ceramic composite body or the metallic matrix and the alloy to be melted, in an atmosphere under pressure of 0.0001 Torr or less. Since this terminal was firmly joined to the substrate, the joined portion was not broken even under repetition of current-passing cycles.

The present invention further relates to a semiconductor-supporting device comprising a substrate made of an insulating material, a conductive member buried in the substrate, a terminal connected to the conductive member and made of a metal or a conductive ceramic material, and a joining member interposed between the terminal and the substrate, joined to the terminal and the substrate and made of a metallic matrix-ceramic composite body.

In such a semiconductor-supporting device, since this terminal is firmly joined to the substrate, the semiconductor-supporting device is not broken even under repetition of current-passing cycles.

Further, the present inventors reached a technical idea that when the above invention was applied to join one member made of a metallic matrix-ceramic composite body other than the terminal to another member made of a ceramic material, a metallic material or a ceramic material in which a metallic member was buried. As a result, it was discovered that the composite body could be joined to said another member by thermally heating both the metallic matrix-ceramic composite body and another member at a temperature enabling the melting of the metallic matrix constituting the metallic matrix-ceramic composite body in an atmosphere under pressure of 0.0001 Torr or less.

In this case, the thermal treatment can be effected, while the metallic matrix-ceramic composite body is in direct contact with another member. Alternatively, an intermediate material composed of an alloy containing 70 mol % or more of a main ingredient of the metallic matrix constituting the metallic matrix-ceramic composite body may be interposed between them in the thermal treatment.

The present invention relates to the joined body obtained by each of the above producing processes, which comprises one member made of the metallic matrix-ceramic composite body and another member made of the ceramic member, the metallic member or the ceramic member in which the ceramic member is buried.

The present inventors further developed the above-mentioned joining processes, and discovered that while a joining member made of a metallic matrix-ceramic composite body is interposed between one member made of a ceramic member, a metallic member or a ceramic member in which a ceramic member is buried and another member made of a ceramic member, a metallic member or a ceramic member in which a ceramic member is buried, one and another members can be joined together by thermally treating them as well as the joining member at a temperature enabling the melting of the metallic matrix constituting the metallic matrix-ceramic composite body in an atmosphere under pressure of 0.0001 Torr or less.

In this case, the thermal treatment can be effected, while the metallic matrix-ceramic composite body is in direct contact with one and another members. Alternatively, an intermediate material composed of an alloy containing 70 mol % or more of a main ingredient of the metallic matrix constituting the metallic matrix-ceramic composite body may be interposed between the one member and the joining member and/or between another member and the joining member in the thermal treatment.

The present invention further relates to the joined articles obtained by the above processes.

These and other objects, features and advantages of the invention will be appreciated upon reading the following description of the invention when taken in conjunction with the attached drawings, with the understanding that some modifications, variations and changes could be easily made by the skilled person in the art to which the invention pertains.

BRIEF DESCRIPTION OF THE DRAWINGS

For a better understanding of the invention, reference is made to the attached drawings, wherein.

DETAILED DESCRIPTION OF THE INVENTION

Figure 1:
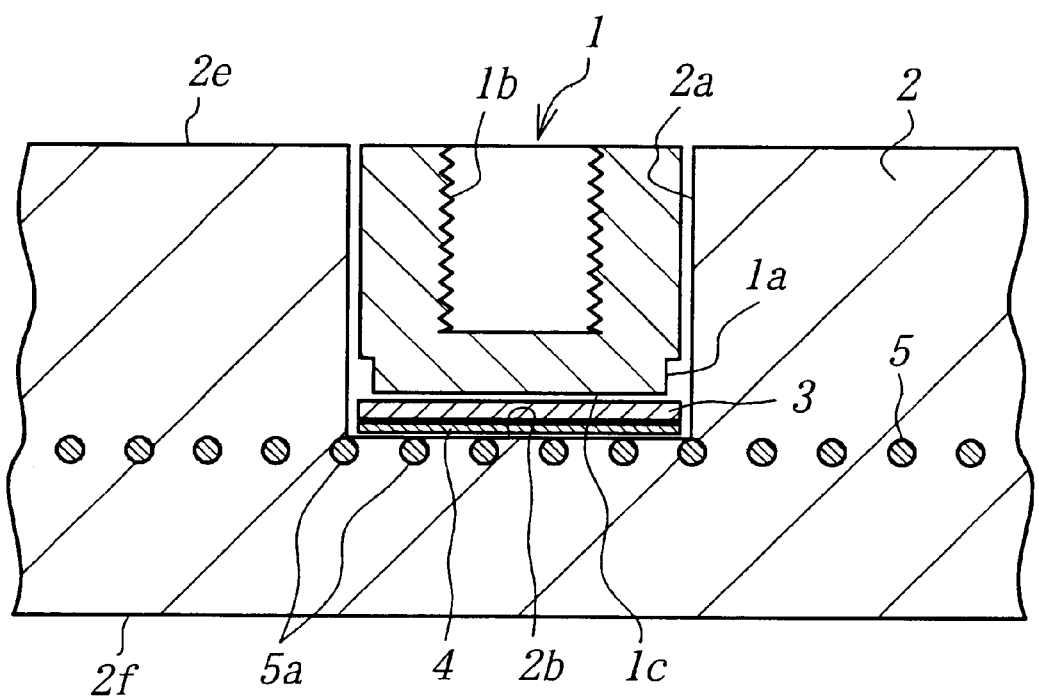
FIG. 1 is a view for schematically showing a terminal 1 made of a metal, an electrically conductive ceramic material or a metallic matrix-ceramic composite material, and a substrate 2 made of an insulating material before they are joined to each other.

Now, the present invention will be explained in more detail.

When the thermal treatment is effected at such a temperature as enabling the metallic matrix of the metallic matrix-ceramic composite body to be melted, the joined article having a smaller amount or no detectable amount of foreign matter at its joining interface can be obtained. Since this joined portion has high heat resistance, no brittleness and high joining strength, it exhibits large durability even when repeatedly undergoing current-passing cycles or heating cycles.

The reason why such joining can be effected is considered to be that residual stress in joining and stress caused by the current-passing cycles are dispersed and mitigated by the rearrangement of the ceramic particles and the matrix metal through slippage at the grain boundaries or the plastically local deformation of the metallic matrix.

The semiconductor-supporting device according to the present invention includes not only a processing device for finely processing Si wafers but also devices for producing liquid crystal panels, micromachines, solar cells, etc. As the semiconductor-supporting device, such a device that includes a susceptor in which a heat-generating element, an electrostatically chucking electrode and a high frequency voltage-generating electrode as well as a shaft and a rear plate connected to the susceptor may be recited by way of example.

The susceptor or the like having particularly excellent current-passing cycle resistance can be provided by applying the present invention to joining the terminal in the semiconductor-supporting device. The insulating lo material is preferably a ceramic material having a thermal conductivity of not more than 20 W/m·K. That the terminal is electrically conductive means that the terminal exhibits such conductivity as being capable of functioning as a high frequency electrode terminal, a heater terminal or an electrostatic chuck terminal. More specifically, the terminal preferably has the volume resistivity of not more than 0.001 Ω·cm.

It was also discovered that if a blind hole or a recess is formed in a substrate and a terminal is placed in this recess and joined to the substrate, the composite body had such a buffering effect to appropriately absorb a melted brazing material or supplement an insufficient amount of the brazing material in joining with the brazing material. Thereby, since the shape of a fillet around the terminal can be made appropriate, variation in the joined state which would be caused by an excess or insufficient amount of the brazing material in the production can be suppressed.

The terminal composed of the metallic matrix-ceramic composite body is particularly preferably used as a high frequency electrode terminal. The reason for this will be explained. If a high frequency electrode terminal made of a metal is used, a high frequency current flows along a limited location near the surface of the terminal, so that the substantial electric resistance increases or heat is caused to be locally generated. Since the metallic matrix-ceramic composite body is like a bundle of fine wires made of an electrically conductive material as viewed from the electric standpoint, the high frequency current is dispersed and flows through these fine wires. Therefore, it is considered that since the effective sectional area of a zone of the metallic matrix-ceramic composite body through which the high frequency current flows is larger as compared with the metallic terminal, the above excellent current-flowing property can be realized.

Since the metallic matrix-ceramic composite body exhibits a low particle-releasing property due to abrasion resistance featuring it, the composite body is preferably used not only for the electrode terminal but also for the fixing terminal.

The metal matrix constituting the above composite body particularly preferably includes aluminum as a main ingredient. This is because the joining temperature can be made relatively low and aluminum itself is a soft metal. Besides Al, Mg, In, Sn, Pb and Bi are preferred.

The mixing amount of the ceramic particles in the composite body may be appropriately selected, and is generally 20 to 80 mol %. If the ceramic particles are present in an amount which is too low or too high, the buffering effect thereof becomes smaller. The particle size distribution of the ceramic particles is preferably wider. The bimodal particle size distribution is preferred. This is because the charging effect of the particles in the metallic matrix is not only enhanced but also the buffering effect can be more increased in a fine structure having non-uniformity to some extent.

The coefficient of thermal expansion of the ceramic material constituting the composite body is preferably substantially equal to or lower than that of a ceramic member to be joined thereto. For example, if the ceramic member is made of AlN or alumina, AlN, alumina, SiC or $SiO_2$ may be selected as the mixing particles.

As the ceramic material constituting the composite body, an aluminum-based ceramic is particularly preferred, and alumina and aluminum nitride are particularly preferred.

The composite body-producing process is not limited to any one, but the following is preferred. For example, given ceramic particles are dispersed in a solvent such as isopropanol, the dispersion is mixed with an organic binder such as a liquid acryl copolymer binder, and a slurry is formed by mixing the mixture under stirring in a large-scale pot mill for 2 to 20 hours. Thereafter, the slurry is granulated to 30 to 100 $\mu$m in particle diameter by using an explosion-preventing type spray dryer. Thereafter, the granulated powder is charged in a given mold, and press molded under pressure of 200 to 7000 $kgf/cm^2$ by using a hydraulic press, and the molded body is dewaxed, thereby obtaining a preform.

Instead of producing the slurry with the organic binder, it may be that a powder into which ethanol is mixed by spraying is obtained, and the resulting powder is press molded in the same manner as mentioned above, thereby producing a preform.

A given metallic matrix is penetrated into the preform. At that time, a self-penetrating method, a pressure-penetrating method or a vacuum penetrating method may be employed. It is particularly preferable that one or more kinds of active metals selected from the group consisting of magnesium, titanium, zirconium and hafnium are incorporated into an aluminum alloy, the matrix of the aluminum alloy is penetrated into voids in the preform according to the non-pressure metal penetrating method, aluminum nitride is produced at interface between the matrix and the ceramic material constituting the preform, thereby enhancing wettability between the ceramic material and the matrix.

In each aspect of the present invention, when the intermediate member is used, it is preferable to use an intermediate material made of a metal having a melting temperature lower than that of the metallic component in the composite body. Such a difference in the melting temperature is acceptable so long as the intermediate member melts prior to the melting of the metallic matrix, and such temperature difference between them is particularly preferably not less than 15° C. At that time, the shape-maintaining property of the entire joined article is improved.

The intermediate member may be of a sheet-like shape, a powder or a paste.

It is preferable to interpose the intermediate member, because the joining interface portion easily takes an inclined structure. The thickness of the intermediate member is preferably 0.05 mm to 0.5 mm. If the intermediate member is too thin, workability drops to cause problems, e.g., the Intermediate material is likely to be solidified in one location. If the intermediate member is too thick, it approaches a joined article composed purely of a metal and a ceramic material, so that the effects based on the composite body are difficult to obtain. The composite body may be used as a buffering member between the metal and the ceramic material, or the composite material itself may be used as a terminal. In either case, since too thin a composite body weakens its buffering effect, the thickness of the composite body is preferably not less than 0.4 mm.

The intermediate member contains not less than 70 mol % of the main component of the metallic matrix constituting the metallic matrix-ceramic composite body. Therefore, in a particularly preferable embodiment, the intermediate member is made of an aluminum alloy containing not less than 70 mol %. In this case, the content of aluminum in the intermediate member is less than 70 mol %, a metal element in the remainder is alloyed with aluminum or the aluminum alloy in the matrix, or forms an intermetallic compound therewith, which may cause brittleness.

It is particularly preferable that not less than 1 mol % and not more than 10 mol % of one or more kinds of active metals selected from the group consisting of magnesium, titanium, zirconium and hafnium (particularly preferably magnesium) are incorporated into the intermediate member.

If the rate of the active metal in the intermediate member is not less than 1 mol %, the affinity with the metallic component or the reinforcement in the substrate is improved to facilitate the penetration. If the rate of the active metal is not more than 10 mol %, the local formation of the intermetallic compound or the like causing the brittleness can be suppressed.

Assuming that the entire content of the intermediate member is taken as 100 mol %, the content of the metal as the main component of the intermediate member is a remainder obtained by subtracting the sum of the content of the active metal component and that of a third component form 100 mol %.

Besides the metal (preferably aluminum) as the above main component and the above active metal(s), a third component may be incorporated into the intermediate member. As the third component, silicon or boron is preferably used, because they give no effect upon the main component. Such a third component functions to decrease the melting point. If the third component is incorporated, the fluidability of the intermediate member is improved even the temperature is the same. The content of the third component is more preferably 1.5 to 10 wt %.

In a more preferable embodiment, the alloy constituting the intermediate member is an aluminum alloy containing 1 to 6 wt % magnesium and 1.5 to 10 wt % silicon.

A film of one or more kinds of metals selected from the group consisting of magnesium, titanium, nickel, zirconium and hafnium can be provided between the joining face of the ceramic member or the substrate and the composite body by sputtering, vapor deposition, friction press contacting, plating or the like. A foil of one or more kinds of metals selected from the group consisting of magnesium, titanium, nickel, zirconium and hafnium may be interposed between the joining face of the ceramic member or the substrate and the composite body.

If the terminal is made of an electrically conductive ceramic material, such as $TiB_2$, $B_4C$, TiC or carbon is preferred.

It is preferable that at least one of an oxidized film or a nitrided film on each of the joining faces of the ceramic member and the substrate is removed by washing these joining faces with an acid solution or an alkaline solution. If such an oxidized film or nitrogen film remains at the joining interface, there is a fear that the intermediate member or the matrix is prevented from penetrating the substrate across the joining interface.

The atmosphere in the thermal treatment needs to be in such a high vacuum effective to prevent oxidation and nitriding of the substrate. For this purpose, the atmosphere is not more than $1 \times 10^{-4}$ Torr. On the other hand, it is not less than $1 \times 10^{-7}$ Torr from the standpoint of preventing the evaporation of the metallic component during the thermal treatment.

The thermally treating temperature for melting the metallic matrix is not less than the melting point of the metal, and preferably higher than this melting point by 20° C. Further, in order to suppress the damage against the ceramic material, the difference between the melting point of the metal and the thermally treating temperature is preferably not more than 50° C.

FIG. 1 shows an embodiment of a susceptor according to the present invention before a terminal 1 is joined to a substrate 2. The substrate 2 of the susceptor is provided with a back face "2e" and an installing face "2f", and a receiving hole "2a" is formed at a side of the back face "2e". The terminal 1 is received in the receiving hole "2a". The terminal 1 is made of a metal, an electrically conductive ceramic material or a metallic matrix-ceramic composite body. A given electrode 5 is received in the substrate 2, while a part 5a of the electrode 5 is exposed to the interior of the receiving hole. The terminal is provided with a recess 1a and a screw hole 1b as shown. A sheet-shaped joining member 3 made of a metallic matrix-ceramic composite body and an intermediate member 4 are interposed between the bottom face 1c of the terminal 1 and the bottom face 2b of the receiving hole 2a.

Figure 2:
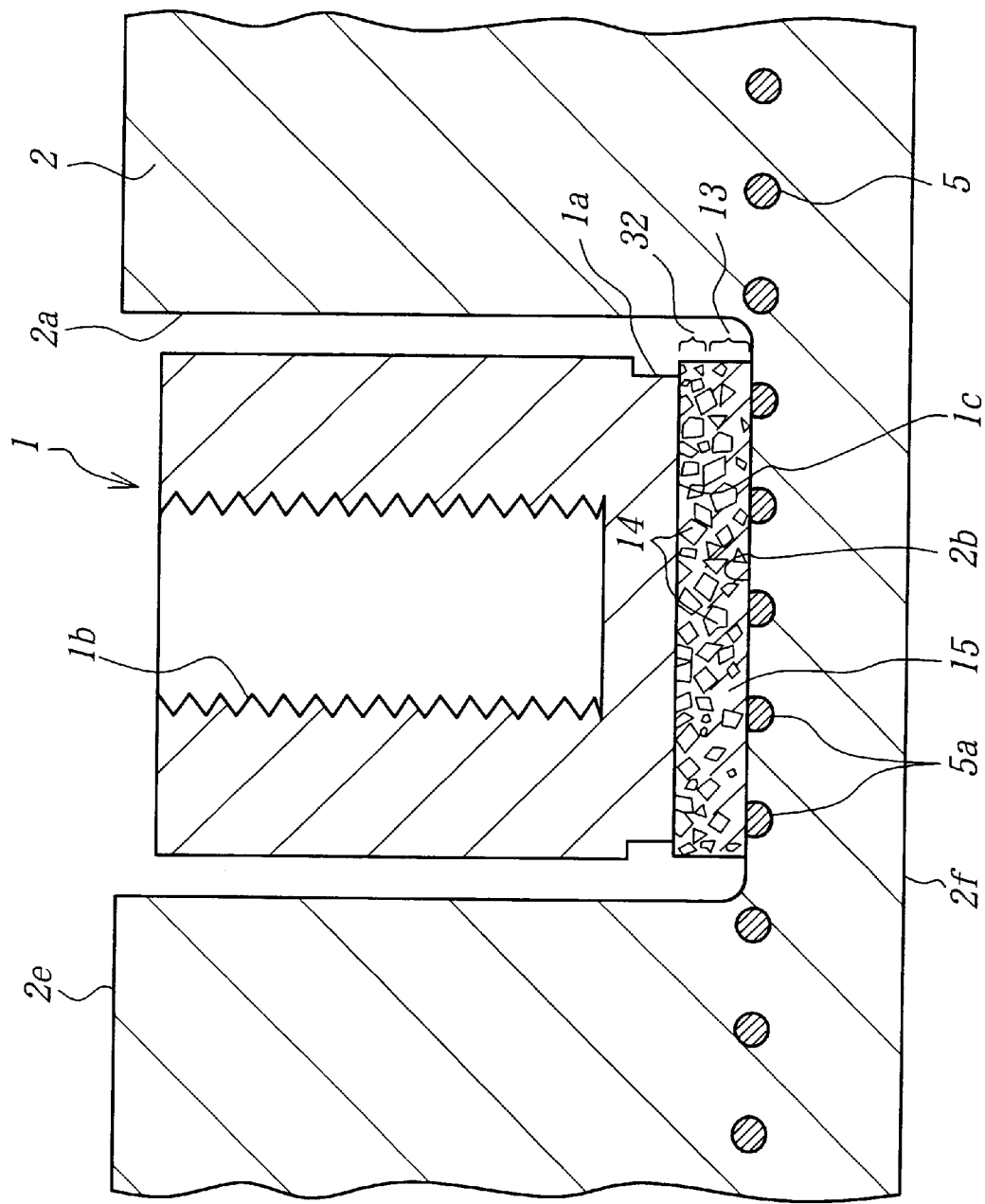
FIG. 2 is a sectional view for schematically showing the terminal 1 and the substrate 2 after they are joined to each other.

A joined article shown in FIG. 2 is obtained by thermally treating the thus obtained assembly. The bottom face 1c of the terminal 1 is joined to the bottom face 2b of the receiving hole 2a by means of a joining material 32 and the joining layer 13. In FIG. 2, the joining material 32 almost maintains the fine structure of the joining member 3 before the thermal treatment. The joining layer 13 is produced through melting the intermediate member placed before the thermal treatment. At that time, a part of the metallic matrix 15 constituting the joining material 32 flows downwardly to the joining layer 13 so that no seam is present between the joining material 32 and the joining layer 13. The metallic matrix of the joining layer 13 is joined to the ceramic member 2 by brazing, and there is a tendency to be more firmly joined to the exposed portion 5a of the electrode 5.

Figure 3:
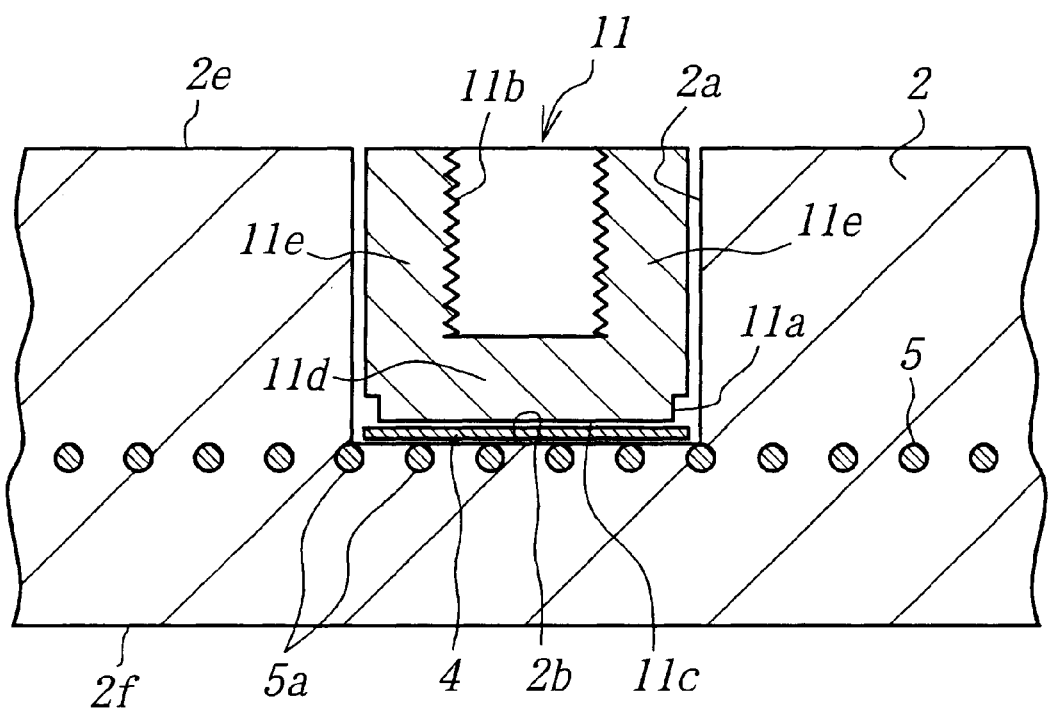
FIG. 3 is a sectional view for schematically showing a terminal 11 made of a metallic matrix-ceramic composite body and a substrate 2 made of an insulating material before they are joined to each other.

FIG. 3 is another embodiment according to the present invention before a terminal is joined to a substrate. The terminal 11 is received in a receiving hole 2a of the substrate 2. The terminal 11 is provided with a recess 11a and a screw hole 11b. The terminal 11 of this embodiment is made of a metallic matrix-ceramic composite body. An intermediate member 4 is interposed between the bottom face 11c of the terminal 11 and the bottom face 2b of the receiving hole 2a. The assembly is thermally treated in this state.

Figure 4:
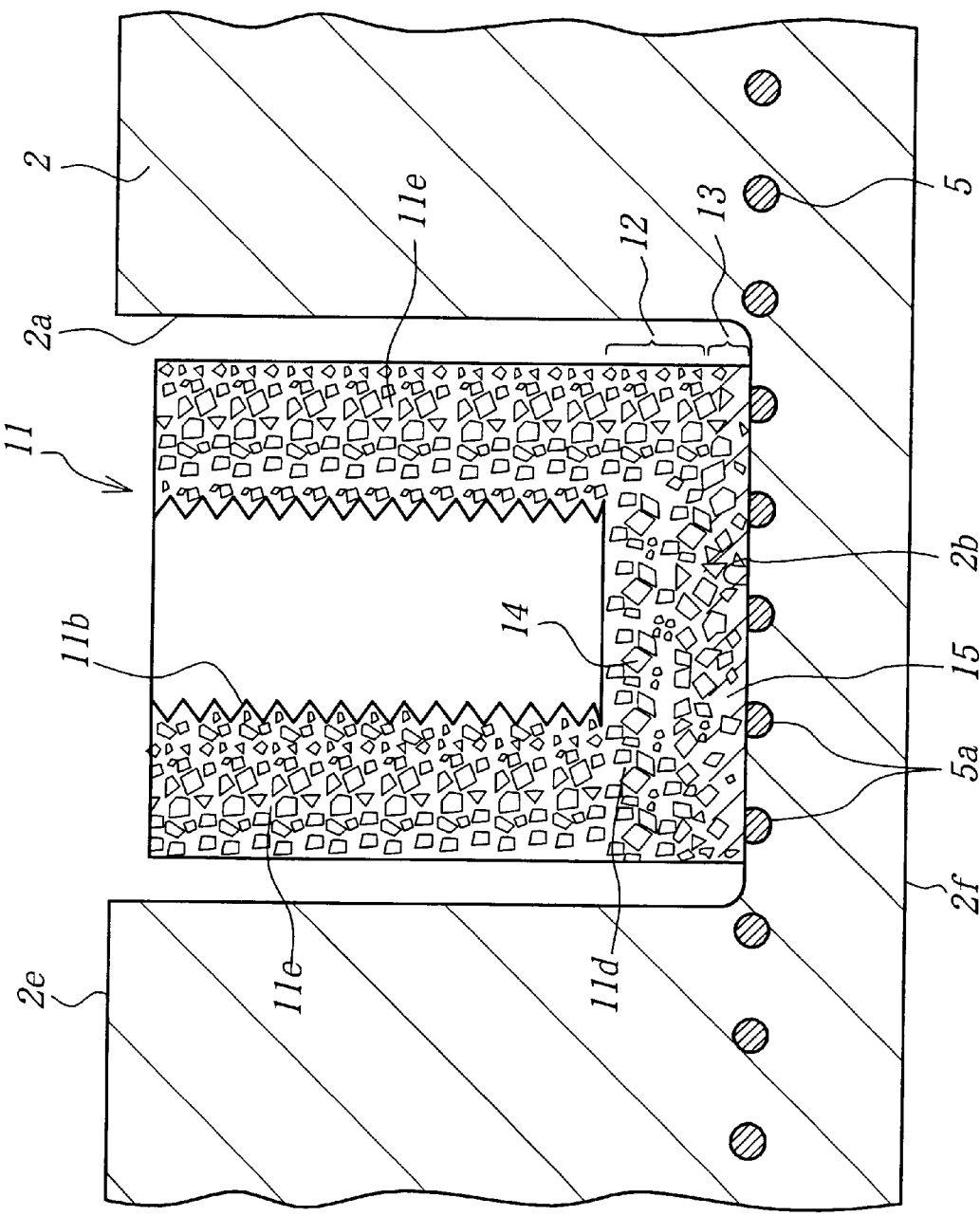
FIG. 4 is a sectional view for schematically showing the terminal 11 and the substrate 2 after they are joined to each other.

FIG. 4 shows the structure of a joined portion between the terminal 11 and the substrate 2 after the thermal treatment. An upper portion 11e of the terminal 11 does not almost change from that before the thermal treatment. A lower portion 11d of the terminal 11 almost corresponds to a zone 12 after the thermal treatment. However, a seam between the zone 12 and the joining layer 13 disappears. The zone 12 composed of the composite material has ceramic particles 14 relatively densely present, and maintains the fine structure of the composite material before joining. On the other hand, since the metallic matrix constituting the composite material melts out and, if an intermediate member is provided upon necessity since the intermediate member melts, the joining layer 13 is composed mainly of the metallic matrix 15 whereas the ceramic particles 14 are relatively thin, The metallic matrix 15 tends to firmly join to the exposed portions 5a of the electrode 5.

Figure 5:
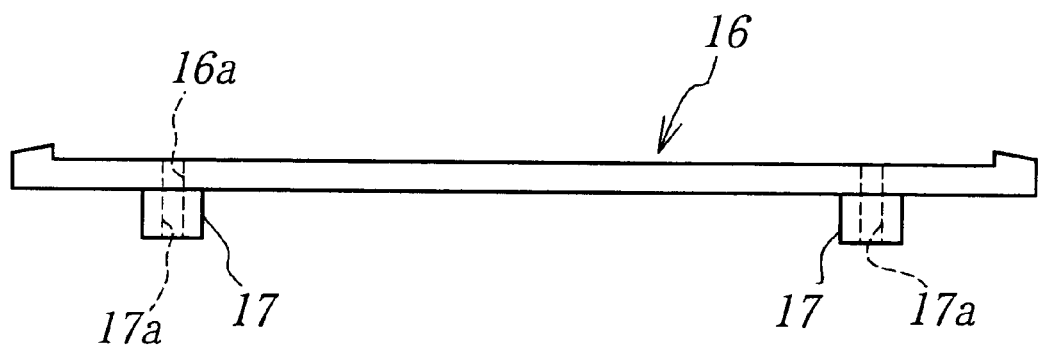
FIG. 5 is a sectional view for showing a state in which two fixing terminals 17 (first members) made of metallic matrix-ceramic composite bodies are joined to a so-called cover plate (a second member)

In an embodiment of FIG. 5, two fixing terminals 17 (first members) made of metallic matrix-ceramic composite bodies are joined to a so-called cover plate (a second member). Reference numerals 16a and 17a denote through-holes, respectively.

Figure 6:
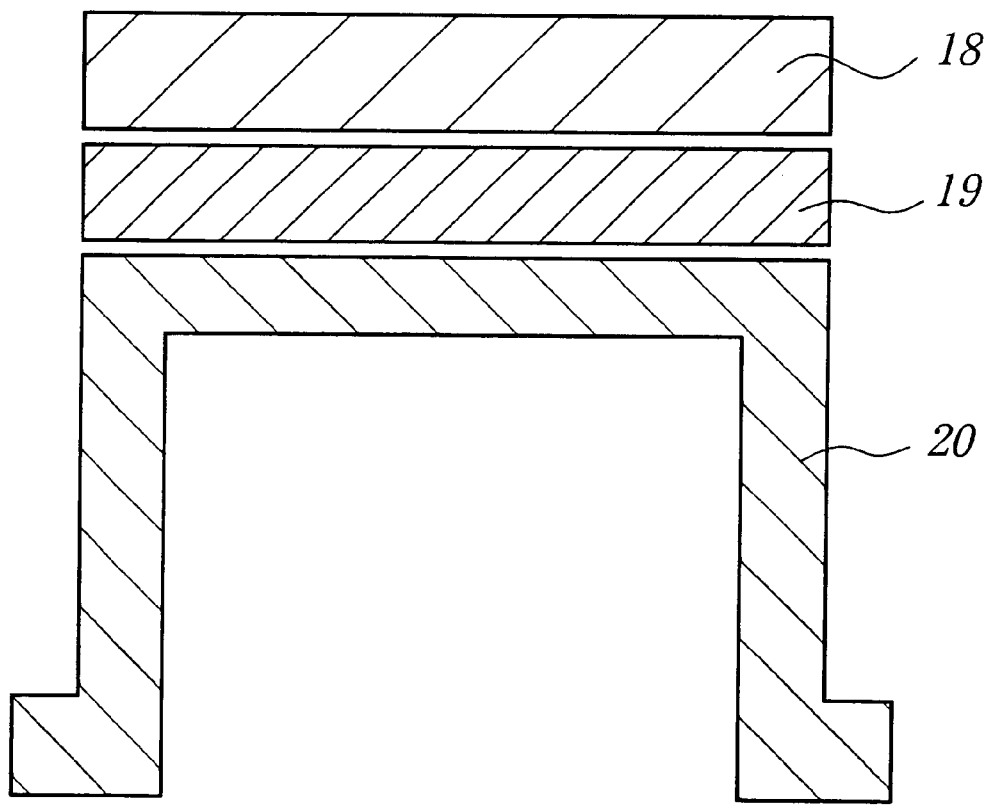
FIG. 6 is a sectional view for showing a state in which a discoid susceptor 18 (a first member) is joined to a substrate 20 made of alumina (a second member) via a flat plate 19 (a joining member) made of a composite body.

In an embodiment of FIG. 6, a discoid susceptor 18 made of such as aluminum nitride (a first member) is joined to a substrate 20 made of alumina (a second member) via a flat plate 19 (a joining member) made of a composite body.

EXAMPLES (Joining Experiment 1)

Granular aluminum nitride having the average particle diameter of 25 μm was dispersed in a solvent of isopropanol, a liquid acryl copolymer binder was added to the dispersion, and the resulting mixture was mixed in a large-scale pot mill under stirring for 4 hours, thereby obtaining a slurry. This slurry was granulated by using an explosion-preventing type spray dryer, thereby obtaining spherically granulated powder having the average granular diameter of about 150 μm. The thus granulated powder was charged into a given mold, and axially press molded under pressure of 200 kgf/cm² by using a oil hydraulic press, thereby producing a large preform having a diameter of 380 mm and a thickness of 30 mm.

After this preform was fully dried and dewaxed, and then contacted with a melt of an aluminum alloy (Al: 92.6 mol %, Mg: 5.5 mol %, silicon: 1.9 mol %) at 900° C. in a $N_2$-1% $H_2$ atmosphere under 1.5 atms pressure for 24 hours, thereby immersing aluminum into the preform according to a non-pressure metal immersing process. Then, the preform was pulled up from the melt, thereby obtaining a composite body. The amount of AlN grains incorporated into the composite body was 70 mol %. As a result, the composite body had dimension of 20×20×20 mm. On the other hand, a sintered sample of aluminum nitride having purity of 99.9% was obtained in dimensions of 20×20×20 mm.

Each of joining end faces of the composite sample and the AlN sintered sample was ground with a #800 grinding stone. Next, after each of the ground faces was washed with acetone and isopropyl alcohol, they were washed with 30% ammonia water at 70° C. for 10 minutes. A single alloy sheet of an Al-10 Si-1.5 Mg alloy sheet may (or can) rolled to dimensions of 20×20×0.1 mm was inserted between the composite material and the AlN sintered sample. After a carbon black sheet having dimensions of 20×20×10 mm thickness) and an Mo block having dimensions of 20×20×10 mm in thickness are piled on the laminate. The resulting laminate was heated up to 640° C. under vacuum of less than $3 \times 10^{-5}$ Torr, and held there for 10 minutes, and cooled in a furnace. According to JIS R 1601, a 4-point bending strength was measured to be 170 MPa.

Figure 7:
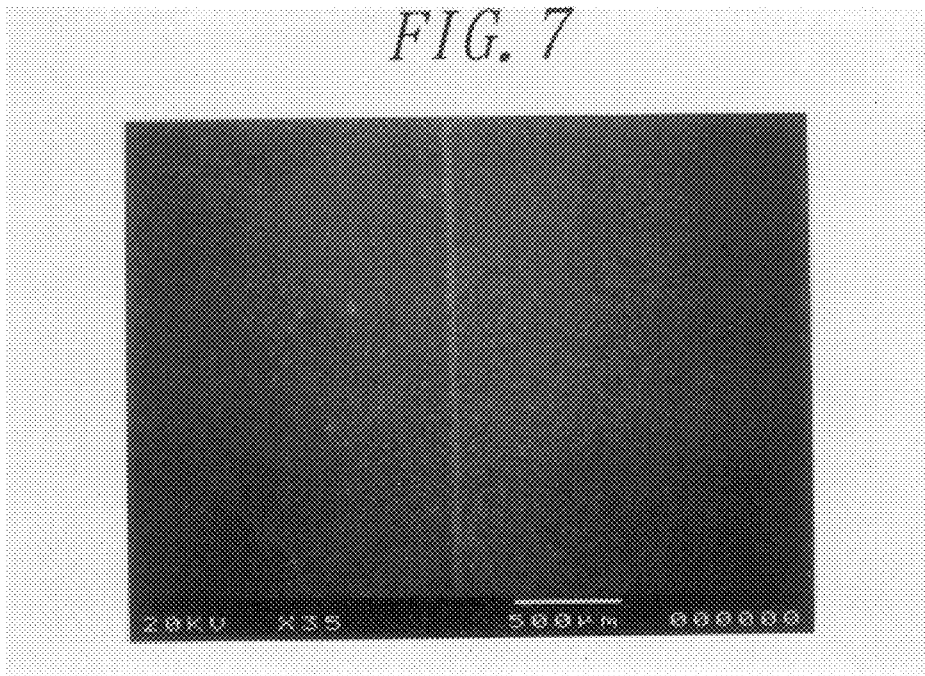
FIG. 7 is a photograph showing a secondary electron image of a joined interface in Joining Experiment 1.
Figure 8:
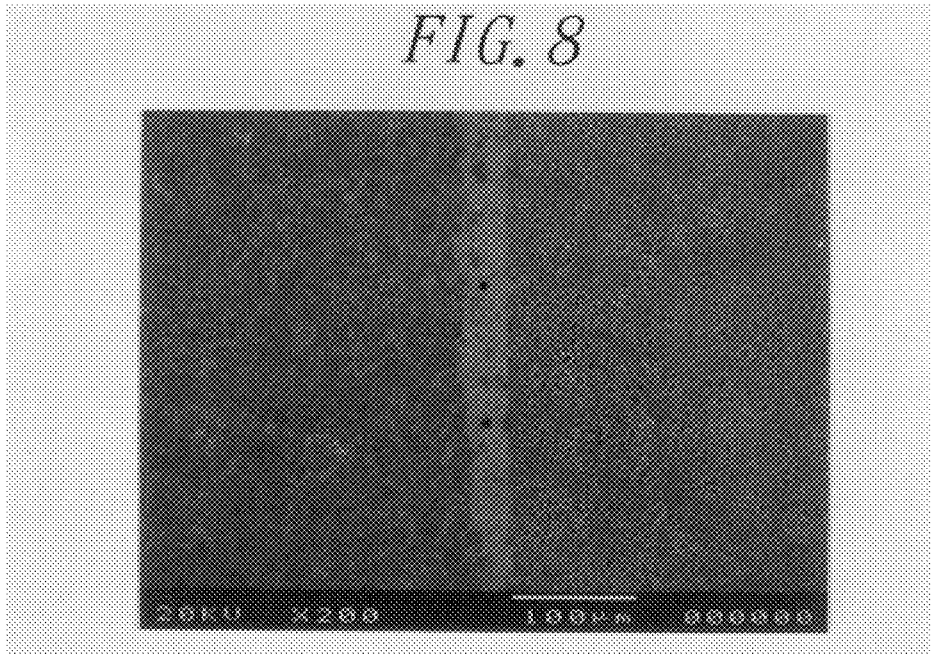
FIG. 8 is a photograph showing a secondary electron image of a joined interface in Joining Experiment 1.

FIGS. 7 and 8 are photographs showing secondary electron images of the composite body and the AlN sintered sample.

(Joining Experiment 2)

After each of the ground faces was washed, the ground face of the AlN sintered sample was plated with Ni. The remainder was the same as in Joining Experiment 1. The bending strength was 80 MPa.

As a metallic matrix-ceramic composite body, a block-shaped sample obtained by making composite SiC powder having the average particle diameter of 70 μm and an aluminum alloy according to a non-pressure immersing process was used. The incorporated amount of SiC was 70 mol %. Except this, the remainder was the same as in Joining Experiment 1. The bending strength was 80 MPa.

(Joining Experiment 4)

After each of the ground faces was washed, the ground face of the AlN sintered sample was plated with Ni. The remainder was the same as in Joining Experiment 3. The bending strength was 100 MPa.

(Joining Experiment 5)

A composite body was directly contacted with an AlN sintered body without a sheet of the Al-9 Si-1.0 Mg alloy being interposed between them. Except for this, the remainder was the same as in Experiment 3. The bending strength was 50 MPa.

(Joining Experiment 6)

A composite body was directly contacted with an AlN sintered body without a sheet of the Al-10 Si-1.5 Mg alloy being interposed between them. Except for this, the remainder was the same as in Experiment 4. The bending strength was 70 MPa.

(Joining Experiment 7)

Instead of an AlN sintered sample, 99.5 wt % alumina was used. Except for this, the remainder was the same as in Experiment 2. The bending strength was 110 MPa.

(Joining Experiment 8)

Instead of an AlN sintered sample, 99.6 wt % alumina was used. Except for this, the remainder was the same as in Experiment 4. The bending strength was 130 MPa.

(Joining Experiment 9)

Instead of an AlN sintered sample, an Fe-50.5 Ni alloy was used. Except for this, the remainder was the same as in Experiment 1. The bending strength was 35 MPa.

The density, the coefficient of thermal expansion and the Young's modulus are shown with respect to each of the composite samples and the Fe-50.5 Ni alloy samples.

(Joining Experiment 10)

In Joining Experiment 2, a metallic matrix-ceramic composite material sample was in a shape of 20 mm×20 mm×4 mm, and an AlN sintered sample was in a shape of 20 mm×20 mm×18 mm. A molybdenum sample having a shape of 20 mm×20 mm×18 mm was joined to the composite material sample via an alloy sheet having a shape of Al-10Si-1.5 Mg at a surface of which is opposite to that to which the AlN sintered sample was joined. Except for the above, the joining was effected in the same manner as in Joining Experiment 2. The bending strength of the thus obtained joined article was 90 MPa.

TABLE 1

| | Metallic matrix-ceramic complex body | | |
|---|---|---|---|
| | Al-AlN | Al-SiC | Fe-50.5Ni |
| Density g/cm$^3$ | 3.1 | 3.1 | 8.3 |
| Coefficient of thermal expansion ppm/K (40–500° C.) | 10.3 | 8.3 | 9.9 |
| Young's modulus at room temperature GPa | 200 | 250 | 160 |

(Terminal-Joining Experiment A)

Figure 9:
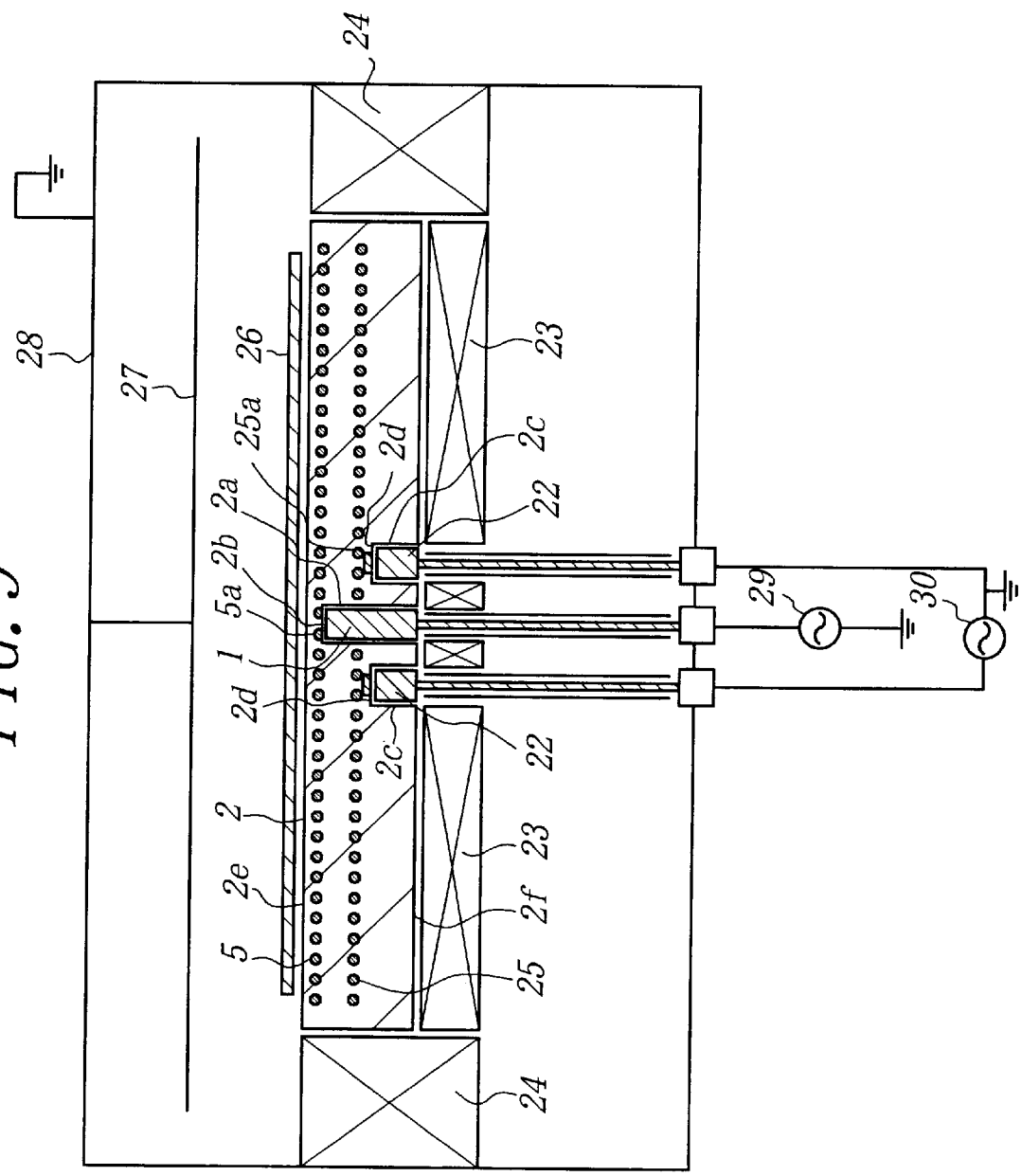
FIG. 9 is an outline view of a current-passing cycle tester.

As explained by using FIG. 1, a terminal 1 was joined to a substrate 2. More particularly, as schematically shown in FIG. 9, a susceptor was produced, and evaluated according to FIG. 8. A Mo mesh 5 functioning as a high frequency electrode and an electrostatic chuck electrode as well s a Mo coil 25 as a heat-generating element were buried in a molded body made of AlN wilt a purity of 99.9%, and the resultant was sintered, thereby obtaining an electrostatic chuck heater. One high frequency electrode terminal 1 was attached to the Mo mesh 5, and two electrode terminals 22 were attached to the Mo coil. A reference numeral 25a denotes an exposed portion of the coil.

Each of the electrode terminals 1, 22 was made of a metallic matrix-ceramic composite body as used in Joining Experiment 1. As shown in FIG. 1, an alloy sheet (Al-10Si-1.5 Mg) 4 having a diameter of 5 mm and a thickness of 0.2 mm, a composite material plate 3 worked to a diameter of 5 mm and a thickness of 1.3 mm (prepared from a metallic matrix-ceramic composite body used in Joining Experiment 1) and an electrode terminal having a diameter of 7 mm and a thickness of 7 mm were placed in this order on a bottom 2b of a round hole 2a to which the Mo mesh was exposed at 5a. The electrode terminal and the alloy sheet were washed with acetone and iropropyl alcohol. The composite material plate 3 and the bottom portion of the receiving hole were washed with acetone and iropropyl alcohol, and then with 30% ammonia water at 70° C. An Mo block having a shape of 20 mm×20 mm×50 mm (thickness) was piled on the electrode terminal 1. For the coil, electrode terminals were similarly set. The assembly was heated to 640° C. in vacuum in a furnace under pressure of not more than 3×10$^{-5}$ Torr, held there for 10 minutes, and cooled in the furnace. Reference numerals 23, 24 denote heat-resistant bricks, and a reference numeral 26 a silicone wafer.

The thus obtained electrostatically chucking heater was fitted to a vacuum chamber 28, an RF power source 29 was connected to the high frequency electrode terminal 1, and an AC power source 30 controlled by a thyristor was connected to the heater terminal 22. A reference numeral 27 denotes a high frequency electrode. The apparatus was heated at a heating rate of 20° C./min. in argon under pressure of 0.1 Torr, held at 400° C. for 10 minutes, and then left to be cooled after the power source was turned off. After the apparatus was cooled down to 100° C., it was heated again, and held at the above temperature. The above cycling was repeated 50 times. The RF voltage was applied only at the time of holding the apparatus at 400° C.

(Terminal-Joining Experiment B)

With respect to Terminal-Joining Experiment A, three electrodes, 11 were made of molybdenum. A composite material plate having a round board shape of a diameter of 5 mm and a thickness of 2 mm (obtained from a metallic matrix-ceramic composite body as used in Joining Experiment 1) was interposed between each of the molybdenum terminals and a bottom face of a receiving hole. An alloy sheet (Al-10 Si-1.5 Mg) having a diameter of 5 mm and a thickness of 0.2 mm was interposed each of between the terminal and the composite material plate and between the composite material plate and the bottom face of the receiving hole. Except for the above, an electrostatically chucking heater was produced in the same manner as in Terminal-Joining Experiment A, and subjected to the above 50-cycle thermally cycling test. Then, a section of near each terminal of the heater was observed, which revealed no problem such as cracking.

(Terminal-Joining Experiment C)

Next, three electrode terminals were made of the Fe-50.5 Ni alloy used in Joining Experiment 9, not of a metallic matrix-ceramic composite material. Except for the above, an electrostatically chucking heater was produced in the same manner as in Terminal-Joining Experiment A, and subjected to a similar test. As a result, the RF electrode terminal peeled at the time of 29 cycles, which disabled the voltage application. Then, the current-passing cycles were repeated for the heater only. After 50 cycles, a section of near the terminal 22 was observed, which revealed cracking near the joint.

As is obvious from the above, according to the present invention, durability at the joint portion between the insulating material and the terminal in the current-passing cycles can be enhanced in the semiconductor-supporting device comprising the substrate made of the insulating material, the conductive member buried in the substrate, and the terminal connected to the conductive member.

Further, the present invention can provide the process for joining the metallic matrix-ceramic composite body to the ceramic material, the metal or the ceramic material in which the metal is buried.

Furthermore, the present invention can provide a new joining process for joining one member made of a ceramic material or a metal to another member made of a ceramic or a metal.

What is claimed is:

1. A semiconductor-supporting device comprising a substrate made of an insulating material, a conductive member buried in the substrate, a terminal connected to the conductive member and made of a metal or a conductive ceramic material, a joining member interposed between the terminal and the substrate, joined to the terminal and the substrate and made of a metallic matrix-ceramic composite body comprising at least one ceramic selected from the group consisting of granular alumina and granular aluminum nitride.

2. The semiconductor-supporting device set forth in claim 1, wherein the insulating material is a ceramic material having a thermal conductivity of not less than 20 W/m·K.

3. The semiconductor-supporting device set forth in claims 1 or 2, wherein a metal constituting the metallic matrix-ceramic composite body contains aluminum as a main component thereof.

4. The semiconductor-supporting device set forth in claim 1, wherein said terminal comprises molybdenum or nickel and said substrate is made of alumina or aluminum nitride.

* * * * *